(12) United States Patent
Yano et al.

(10) Patent No.: US 8,405,307 B2
(45) Date of Patent: Mar. 26, 2013

(54) LED LAMP

(75) Inventors: Tadashi Yano, Kyoto (JP); Masanori Shimizu, Kyoto (JP); Kiyoshi Takahashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 12/836,219

(22) Filed: Jul. 14, 2010

(65) Prior Publication Data

US 2011/0006673 A1 Jan. 13, 2011

Related U.S. Application Data

(63) Continuation of application No. 10/585,456, filed as application No. PCT/JP2004/019088 on Dec. 21, 2004, now Pat. No. 7,791,274.

(30) Foreign Application Priority Data

Jan. 7, 2004 (JP) .................................. 2004-001635

(51) Int. Cl.
 *H05B 33/00* (2006.01)
(52) U.S. Cl. ......................................... 313/512; 362/33
(58) Field of Classification Search .................. 313/512; 362/33
 See application file for complete search history.

(56) References Cited

U.S. PATENT DOCUMENTS

| | | | |
|---|---|---|---|
| 5,001,609 A | 3/1991 | Gardner et al. | |
| 5,813,753 A | 9/1998 | Vriens et al. | |
| 5,931,570 A | 8/1999 | Yamuro | |
| 5,998,925 A | 12/1999 | Shimizu et al. | |
| 6,155,699 A | 12/2000 | Miller et al. | |
| 6,686,691 B1 | 2/2004 | Mueller et al. | |
| 6,734,465 B1 | 5/2004 | Taskar et al. | |
| 6,922,024 B2 | 7/2005 | Yano et al. | |
| 6,940,101 B2 | 9/2005 | Yano et al. | |
| 6,949,772 B2 | 9/2005 | Shimizu et al. | |
| 6,963,166 B2 | 11/2005 | Yano et al. | |
| 2002/0088985 A1 | 7/2002 | Komoto et al. | |
| 2002/0114168 A1* | 8/2002 | Pelka et al. | 362/555 |
| 2002/0130326 A1 | 9/2002 | Tamura et al. | |
| 2004/0032728 A1 | 2/2004 | Galli | |

(Continued)

FOREIGN PATENT DOCUMENTS

| | | |
|---|---|---|
| CN | 2567782 Y | 8/2003 |
| JP | 2-86154 | 7/1990 |

(Continued)

OTHER PUBLICATIONS

U.S. Appl. No. 11/277,952, filed Apr. 13, 2006, Shimizu et al.

(Continued)

*Primary Examiner* — Anh Mai
*Assistant Examiner* — Andrew Coughlin
(74) *Attorney, Agent, or Firm* — McDermott Will & Emery LLP

(57) ABSTRACT

An LED lamp 100 includes: an LED chip 10; a phosphor resin portion 12 that covers the LED chip 10; and a light-transmissive member 20 that covers the phosphor resin portion 12. The phosphor resin portion 12 includes: a phosphor for converting the emission of the LED chip 10 into light that has a longer wavelength than the emission; and a resin in which the phosphor is dispersed. The surface of the light-transmissive member 20 includes an upper surface portion 22 located over the LED chip 10 and a side surface portion 24 located around and below the upper surface portion 22. At least a part (low-transmittance part 26) of the side surface portion 24 of the light-transmissive member 20 has lower transmittance than the upper surface portion 22.

8 Claims, 8 Drawing Sheets

U.S. PATENT DOCUMENTS

| | | | |
|---|---|---|---|
| 2004/0264185 A1* | 12/2004 | Grotsch et al. | 362/231 |
| 2005/0077535 A1 | 4/2005 | Li | |
| 2005/0207165 A1 | 9/2005 | Shimizu et al. | |
| 2005/0237747 A1 | 10/2005 | Shimizu et al. | |
| 2005/0242362 A1 | 11/2005 | Shimizu et al. | |
| 2005/0263777 A1 | 12/2005 | Yano et al. | |
| 2005/0274973 A1 | 12/2005 | Takahashi et al. | |
| 2006/0131594 A1 | 6/2006 | Yano et al. | |

FOREIGN PATENT DOCUMENTS

| | | |
|---|---|---|
| JP | 4-92660 | 8/1992 |
| JP | 05-027688 | 2/1993 |
| JP | 5-27688 A | 2/1993 |
| JP | 08-160885 | 6/1996 |
| JP | 08-234684 | 9/1996 |
| JP | 10-065221 | 3/1998 |
| JP | 11-26817 A | 1/1999 |
| JP | 11-87778 A | 3/1999 |
| JP | 2000-31530 A | 1/2000 |
| JP | 2001-083893 | 3/2001 |
| JP | 2002-060747 | 2/2002 |
| JP | 2002-304903 A | 10/2002 |
| JP | 2002-344031 A | 11/2002 |

OTHER PUBLICATIONS

Chinese Office Action, with English Translation, issued in Corresponding Chinese Patent Application No. 200480039835.5, dated on Aug. 31, 2007.

Co-pending U.S. Appl. No. 10/543,243, filed Jul. 25, 2005.

International Preliminary Report on Patentability issued in International Application No. PCT/JP2004/019088, dated Oct. 12, 2006.

* cited by examiner

US 8,405,307 B2

LED LAMP

RELATED APPLICATIONS

This application is a Continuation of U.S. application Ser. No. 10/585,456, filed on Jul. 7, 2006, now U.S. Pat. No. 7,791,274 which is the U.S. National Phase under 35 U.S.C. §371 of International Application No. PCT/JP2004/019088, filed on Dec. 21, 2004, claiming priority of Japanese Patent Application No. 2004-001635, filed on Jan. 7, 2004, the entire contents of each of which are hereby incorporated by reference.

TECHNICAL FIELD

The present invention relates to an LED lamp and more particularly relates to an LED lamp that can be used effectively as a white light source for general illumination.

BACKGROUND ART

A light emitting diode (which will be referred to herein as an "LED chip") is a semiconductor device that can radiate an emission in a bright color with high efficiency even though its size is small. The emission of an LED chip has an excellent monochromatic peak. To produce white light from LED chips, a conventional LED lamp arranges red, green and blue LED chips close to each other and gets the light rays in those three different colors diffused and mixed together. An LED lamp of this type, however, easily produces color unevenness because the LED chip of each color has an excellent monochromatic peak. That is to say, unless the light rays emitted from the respective LED chips are mixed together uniformly, color unevenness will be produced inevitably in the resultant white light. Thus, to overcome such a color unevenness problem, an LED lamp for producing white light by combining a blue LED chip and a yellow phosphor was developed (see Patent Documents Nos. 1 and 2, for example).

According to the technique disclosed in Patent Document No. 1, white light is produced by combining together the emission of a blue LED chip and the yellow emission of a yellow phosphor, which is produced when excited by the emission of the blue LED chip. That is to say, the white light can be produced by using just one type of LED chips. That is why the color unevenness problem, which arises when white light is produced by arranging multiple types of LED chips close together, is avoidable.

The LED lamp with the bullet-shaped appearance as disclosed in Patent Document No. 2 has a configuration such as that illustrated in FIG. 1. As shown in FIG. 1, the bullet-shaped LED lamp 200 includes an LED chip 121, a bullet-shaped transparent enclosure 127 to enclose the LED chip 121, and leads 122a and 122b to supply current to the LED chip 121. A cup reflector 123 for reflecting the emission of the LED chip 121 in the direction pointed by the arrow D is provided for the mount portion of the lead 122b on which the LED chip 121 is mounted. The LED chip 121 is encapsulated with a first resin portion 124, in which a phosphor 126 is dispersed and which is further covered with a second resin portion 125. If the LED chip 121 emits a blue light ray, the phosphor 126 is excited by the blue light ray to produce a yellow light ray. As a result, the blue and yellow light rays are mixed together to produce white light.

Patent Document No. 1: Japanese Patent Application Laid-Open Publication No. 10-242513
Patent Document No. 2: Japanese Patent No. 2998696

DISCLOSURE OF INVENTION

Problems to be Solved by the Invention

As those white LED chips producing little color unevenness have been developed, LED lamps are now used not only as backlights for image display devices or headlights for vehicles but also as various types of general illumination. Also, as a result of recent research and development of white LED chips, a sufficiently high luminous flux can be obtained.

However, the present inventors further analyzed conventional LED lamps to discover that although everybody in the prior art has been paying most of their attention to how to minimize the color unevenness and how to increase the luminous flux of the LED lamps, viewer's comfortableness also counts and should not be ignored if the LED lamps are supposed to be used as general illumination. More particularly, those LED lamps' uncomfortable glaring impression on the viewer has not been considered so far. That is to say, as far as general illumination is concerned, "the brighter or the more uniform in color, the better" policy is often too simple to work. And it is not preferable to make such a glaring impression on the viewer.

The "glare" refers to viewer's decreased ability to recognize objects or uncomfortableness due to the glaring impression within his or her vision, which is formed when a light source with an excessively high luminance or a reflective object is present within his or her sight and projects light toward his or her eyes. An LED lamp uses the emissions of multiple LED chips and therefore has a strong directivity. That is why if the light produced by an LED lamp is projected toward a desk or something a person is working at, then the light will enter his or her eyes too rarely to create the glaring impression. However, if the light produced by an LED lamp is radiated toward the entire room, the user will have that glaring impression more often than a situation where the light produced by a low-directivity light source such as a fluorescent lamp enters his or her eyes.

In order to overcome the problems described above, a primary object of the present invention is to provide an LED lamp that can reduce the glare significantly.

Means for Solving the Problems

An LED lamp according to the present invention includes: an LED chip; a reflector with a reflective surface that reflects the emission of the LED chip at least partially; and a light-transmissive member that covers the LED chip. The surface of the light-transmissive member includes an upper surface portion located over the LED chip and a side surface portion located below the upper surface portion. At least a part of the side surface portion has lower transmittance than the upper surface portion.

In one preferred embodiment, the light-transmissive member also covers at least the reflective surface of the reflector.

In another preferred embodiment, the LED lamp further includes a wavelength converting portion, which covers the LED chip. The wavelength converting portion includes: a phosphor for converting the emission of the LED chip into light that has a longer wavelength than the emission; and a resin in which the phosphor is dispersed. The wavelength converting portion is covered with the light-transmissive member.

In still another preferred embodiment, at least the part of the side surface portion of the light-transmissive member has been processed so as to have the lower transmittance than the upper surface portion by subjecting the light-transmissive member to a surface treatment.

In yet another preferred embodiment, at least the part of the side surface portion of the light-transmissive member has a transmittance of substantially zero.

In yet another preferred embodiment, at least the part of the side surface portion of the light-transmissive member is arranged so as to define an angle of approximately degrees with respect to an optical axis that extends through the LED chip.

In yet another preferred embodiment, the light-transmissive member includes a substantially hemispherical or bullet-shaped portion, and the upper surface portion of the light-transmissive member is arranged so as to define an angle of at most 15 degrees with respect to an optical axis that extends through the LED chip.

In yet another preferred embodiment, the upper surface portion of the light-transmissive member is substantially planar.

In yet another preferred embodiment, all of the side surface portion of the light-transmissive member has lower transmittance than the upper surface portion.

In yet another preferred embodiment, the upper surface portion of the light-transmissive member and/or the reflective surface has a diffusing surface.

In yet another preferred embodiment, there is a gap between the side surface of the wavelength converting portion and the reflective surface of the reflector, and the gap is filled with the light-transmissive member.

Another LED lamp according to the present invention includes: a substrate; an array of LED chips that are arranged two-dimensionally on the substrate; a reflector with a plurality of reflective surfaces, each of which reflects the emission of an associated one of the LED chips at least partially; and a plurality of light-transmissive members, each of which covers an associated one of the LED chips. Some of the light-transmissive members are located in the outermost part of the array of LED chips, and the surface of at least each of those light-transmissive members includes an upper surface portion located over an associated one of the LED chips and a side surface portion located below the upper surface portion. At least a part of the side surface portion has lower transmittance than the upper surface portion.

In one preferred embodiment, the light-transmissive members are combined together on the surface of the reflector.

Effects of the Invention

In an LED lamp according to the present invention, at least a part of the side surface portion of a light-transmissive member that covers an LED chip has lower transmittance than the upper surface portion thereof, thus controlling the emission of light through the side surface portion that easily causes the glare. As a result, the LED lamp of the present invention can minimize the glare effectively.

DESCRIPTION OF REFERENCE NUMERALS

Figure 1:
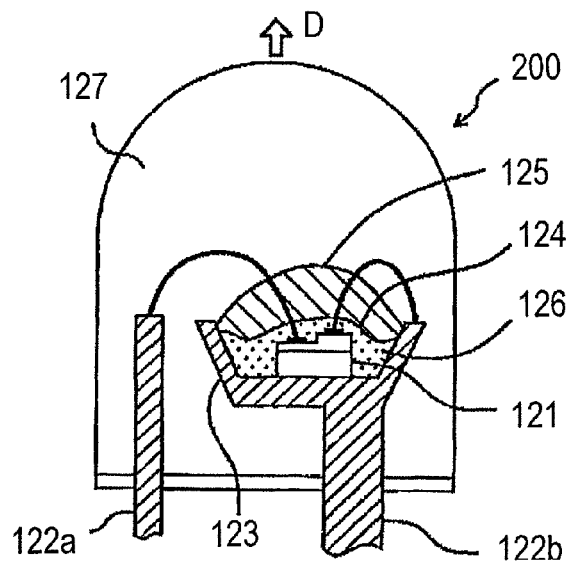
FIG. 1 is a cross-sectional view schematically illustrating a configuration for a conventional LED lamp with a bullet shaped appearance.

10 LED chip (LED element)
12 phosphor resin portion
20 light-transmissive member
22 upper surface portion of light-transmissive member
24 side surface portion of light-transmissive member
26 low-transmittance part
27 diffusing surface
30 substrate
32 base substrate
34 interconnect layer 36 interconnect pattern
38 feeder terminal
40 reflector
42 reflective surface
44 opening
60 body portion
62a lead
62b lead
64 receptacle portion
65 slot
70 wiring pattern
72 bonding wire
100, 110, 120 lamp
200 lamp

BEST MODE FOR CARRYING OUT THE INVENTION

Hereinafter, preferred embodiments of the present invention will be described with reference to the accompanying drawings, in which any pair of components having substantially the same function and illustrated in multiple drawings will be identified by the same reference numeral for the sake of simplicity.

Embodiment 1

Figure 2:
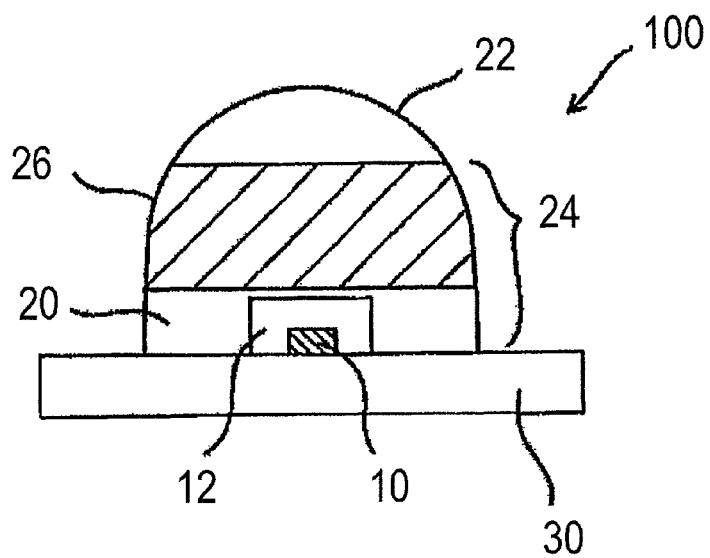
FIG. 2 is a cross-sectional view schematically illustrating a configuration for an LED lamp 100 according to a preferred embodiment of the present invention.
Figure 3:
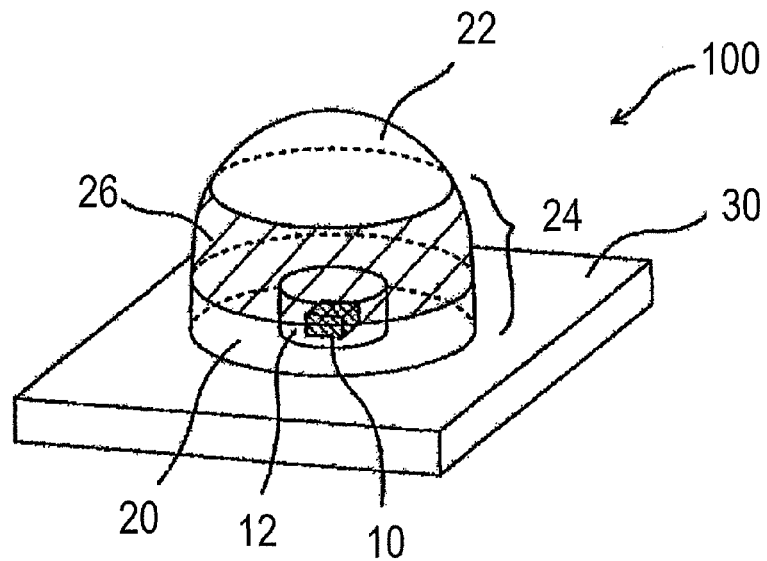
FIG. 3 is a perspective view schematically illustrating the configuration of the LED lamp 100 according to the preferred embodiment of the present invention.

First, a first specific preferred embodiment of an LED lamp according to the present invention will be described with reference to FIGS. 2 and 3. FIG. 2 is a cross-sectional view schematically illustrating the configuration of an LED lamp 100 according to this preferred embodiment. FIG. 3 is a perspective view thereof.

The LED lamp 100 includes an LED chip 10, a phosphor resin portion 12 that covers the LED chip 10, and a light-transmissive member 20 that covers the phosphor resin portion 12.

The phosphor resin portion 12 includes a phosphor for converting the emission of the LED chip 10 into light that has a longer wavelength than the emission and a resin in which the phosphor is dispersed.

The light-transmissive member 20 has the function of shutting off (or encapsulating) the phosphor resin portion 12 from the air and may be formed by molding a resin, glass or any other suitable material. In this preferred embodiment, the light-transmissive member 20 is made of an epoxy resin. In addition, the light-transmissive member 20 of this preferred embodiment has not just the function of encapsulating the phosphor resin portion 12 and shutting it off from the air but also a lens function of condensing the light that has been radiated from the LED chip 10.

The surface of the light-transmissive member 20 includes an upper surface portion 22 located over the LED chip and a side surface portion 24 located below the upper surface portion 22. At least a part of the side surface portion 24 of the light-transmissive member 20 functions as a low-transmittance part 26 having a lower transmittance than the upper surface portion 22. By providing such a low-transmittance part 26, the intensity of the light transmitted through the side surface portion 24 of the light-transmissive member 20 becomes lower than that of the light transmitted through the upper surface portion 22.

If the LED lamp 100 is used as a downlight, the light emitted through the upper surface portion 22 of the light-transmissive member 20 will be directed only toward an object that is located under the lamp. On the other hand, the light emitted through the side surface portion 24 of the light-transmissive member 20 easily directly enters the eyes of a person who is located near the lamp. Such light emitted through the side surface portion 24 often gives uncomfortable glaring impression to the viewer. In this LED lamp 100, however, the intensity of the light that has been emitted through the side surface portion 24 to cause such comfortable glaring often is reduced.

In one preferred embodiment, the light-transmissive member 20 is designed so as to include a substantially hemispherical or bullet-shaped portion. In the preferred embodiment illustrated in FIG. 2, the overall light-transmissive member 20 has an almost hemispherical shape.

The low-transmittance part 26 of the light-transmissive member 20 has a band shape so as to surround the side surface portion 24. In this example, the area of the low-transmittance part 26 accounts for at least 30% of the overall area of the side surface portion 24. Alternatively, either almost all, or even all, of the side surface portion 24 may function as the low-transmittance part 26. In this preferred embodiment, the upper end of the low-transmittance part 26 is in contact with the upper surface portion 26. However, a part of the side surface portion 24 may be present between the upper end of the low-transmittance part 26 and the upper surface portion 22.

The low-transmittance part 26 may be formed by subjecting the side surface portion 24 of the light-transmissive member 20 to some surface treatment such as sandblasting, evaporating a predetermined substance, embossing, or chemical polishing. As a result of such a surface treatment, the transmittance of the low-transmittance part 26 can be lower than that of the upper surface portion 22. The transmittance of the low-transmittance part 26 may be decreased to 10% or less of that of the upper surface portion 22, for example. However, the transmittance of the low-transmittance part 26 may also have any other arbitrary value such that a quantity representing the light transmitted through the low-transmittance part 26 (e.g., luminance or luminous flux) becomes less than a predetermined value.

Alternatively, the low-transmittance part 26 may also be formed without subjecting the light-transmissive member 20 to a surface treatment. For instance, if a dispersant such as silica or MgO is added to the light-transmissive member 20 and has its concentration varied from one position to another, the low-transmittance part 26 having a lower transmittance than the upper surface portion 22 can also be obtained. Optionally, the light transmittance of the low-transmittance part 26 may be decreased to substantially zero by making the low-transmittance part 26 of a mask layer (as an opaque portion).

The LED chip 10 of this preferred embodiment is a bare chip LED that is arranged on a substrate 30. The phosphor resin portion 12 that covers the LED chip 10 and the light-transmissive member 20 that covers the phosphor resin portion 12 are also arranged on the substrate 30. In this preferred embodiment, the electrode of the LED chip 10 is flip-chip bonded to a terminal (not shown) on the surface of the substrate 30 and the back surface of the LED chip 10 is also covered with the phosphor resin portion 12.

The LED chip 10 is an LED element that produces light having a peak wavelength falling within the visible range of 380 nm to 780 nm. The phosphor dispersed in the phosphor resin portion 12 produces an emission that has a different peak wavelength from that of the LED chip 10 within the visible range of 380 nm to 780 nm.

In this preferred embodiment, the LED chip 10 is a blue LED element that emits a blue light ray and the phosphor included in the phosphor resin portion 12 is a yellow phosphor that transforms the blue ray into a yellow ray. The blue ray radiated from the LED chip 10 and the yellow ray radiated from the phosphor are mixed together to produce white light.

The LED chip 10 is typically made of a gallium nitride (GaN) based material and emits light with a wavelength of 460 nm, for example. For instance, if a blue-ray-emitting LED chip is used as the LED chip 10, $(Y.Sm)_3$, $(Al.Ga)_5O_{12}$: Ce or $(Y_{0.39}Gd_{0.57}Ce_{0.03}Sm_{0.01})_3Al_5O_{12}$ may be used effectively as the phosphor.

In this preferred embodiment, the phosphor resin portion 12 preferably has a substantially cylindrical shape (see FIG. 3). If the LED chip 10 has approximately 0.3 mm×0.3 mm dimensions on a plan view, then the phosphor resin portion 12 may have a diameter of about 0.7 mm to about 0.9 mm, for example. In that case, the light-transmissive member 20 may have a height of 1 mm to 15 mm and a diameter of 2 mm to 7 mm.

In this preferred embodiment, a reflector with a reflective surface that reflects the emission of the LED chip 10 is arranged around the light-transmissive member 20 but is not illustrated in FIG. 2 or 3 for the sake of simplicity.

Figure 4:
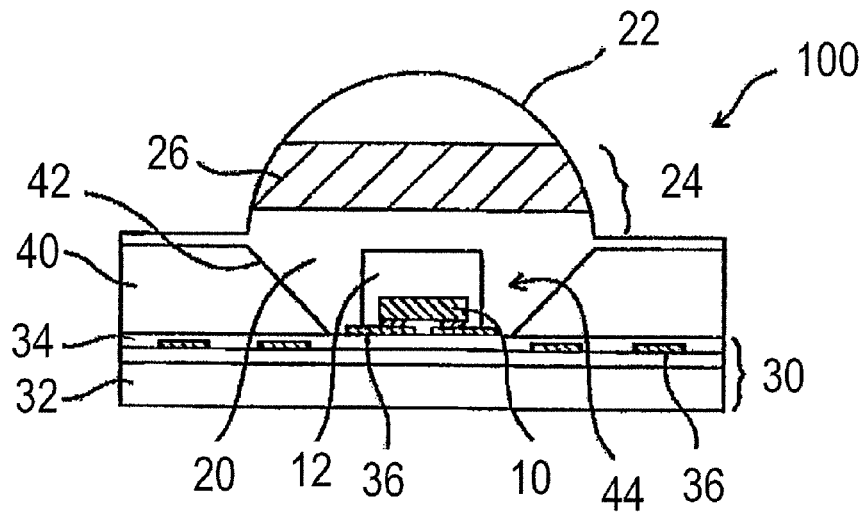
FIG. 4 is a cross-sectional view schematically illustrating a configuration for an LED lamp 100 according to another preferred embodiment of the present invention.

FIG. 4 is a cross-sectional view illustrating an exemplary configuration for a reflector 40 with a reflective surface 42. In the example illustrated in FIG. 4, the reflector 40 with the reflective surface 42 is arranged on the substrate 30. The reflector 40 has an opening 44 to store the phosphor resin portion 12 that covers the LED chip 10. The side surface defining the opening 44 functions as the reflective surface 42 that reflects the emission of the LED chip 10. The reflector 40 is preferably made of a metal such as aluminum, copper, stainless steel, iron or an alloy thereof but may also be made of a resin.

The opening 44 of the reflector 40 is filled with a light-transmissive member 20 that covers the phosphor resin portion 12. Such a light-transmissive member 20 is preferably formed by molding a resin, for example. In the example illustrated in FIG. 4, the upper half of the light-transmissive member 20, protruding upward out of the upper surface of the reflector 40, has a substantially hemispherical shape. This substantially hemispherical portion includes the upper surface portion 22 and the side surface portion 24, at least a part of which is the low-transmittance part 26. In the example illustrated in FIG. 4, the light-transmissive member 20 partially expands horizontally on the upper surface of the reflector 40 to form a thin layer there. That portion of the light-transmissive member 20 that fills the opening 44 of the reflector 40 is in contact with the surfaces of the phosphor resin portion 12 and the reflective surface 42.

In this preferred embodiment, the substrate 30 includes a base substrate 32 and an interconnect layer 34, which has been formed on the base substrate 32. The base substrate 32 may be a metallic substrate, for example. And the interconnect layer 34 includes an interconnect pattern 36 that has been formed on a composite layer consisting of an inorganic filler and a resin. It is to dissipate the heat generated from the LED chips 10 more efficiently that a metallic substrate and a composite layer are used as the base substrate 32 and as the interconnect layer 34, respectively. In this example, the interconnect layer 34 is a part of a multilevel interconnect substrate, and the LED chip 10 is flip-chip bonded to the interconnect pattern 36 on the uppermost layer.

Optionally, an underfill (stress relaxing layer) may be provided between the reflector 40 and the interconnect layer 34. The underfill can not only relax the stress, resulting from the difference in thermal expansion coefficient between the metallic reflector 40 and the interconnect layer 34, but also ensure electrical insulation between the reflector 40 and the uppermost interconnect pattern 36.

Also, in this preferred embodiment, the side surface of the phosphor resin portion 12 is spaced apart from the reflective surface 42 of the reflector 40 as shown in FIG. 4. By providing such a gap, the shape of the phosphor resin portion 12 can be determined more freely without being restricted by that of the reflective surface 42 of the reflector 40. As a result, the color unevenness can be reduced effectively. A similar LED lamp in which a gap is also provided between the side surface of the phosphor resin portion 12 and the reflective surface 42 of the reflector 40 is disclosed in United States Patent Application Publication No. US2004/0100192A1, the entire disclosure of which is hereby incorporated by reference.

The phosphor resin portion 12 has a "substantially cylindrical shape". As used herein, the "substantially cylindrical shape" refers to not only a structure having a completely round cross section parallel to the principal surface of the substrate but also a structure having a polygonal cross section with at least six vertices. This is because a polygon with six or more vertices is substantially axisymmetric and may be regarded as almost identical with a "circle".

If the LED chip 10 is ultrasonic flip-chip bonded onto the substrate 30, then the LED chip 10 will sometimes turn slightly due to ultrasonic vibrations on a plane parallel to the principal surface of the substrate. In such a situation, if the phosphor resin portion 12 had a triangular or quadrangular prism shape, then the spatial distribution of the light would easily change according to the positional relationship between the LED chip 10 and the phosphor resin portion 12. However, even if a substantially cylindrical phosphor resin portion 12 has turned on a plane that is parallel to the principal surface of the substrate, the relative positional relationship between the phosphor resin portion 12 and the LED chip 12 will not change significantly and the spatial distribution of light will be hardly affected.

Only one LED chip 12 is illustrated in FIGS. 3 and 4. However, the LED lamp 100 may include a plurality of LED chips 10. More specifically, the LED lamp 100 may include a two-dimensional (e.g., matrix) arrangement of LED chips, each having the structure shown in FIG. 4.

Figure 5:
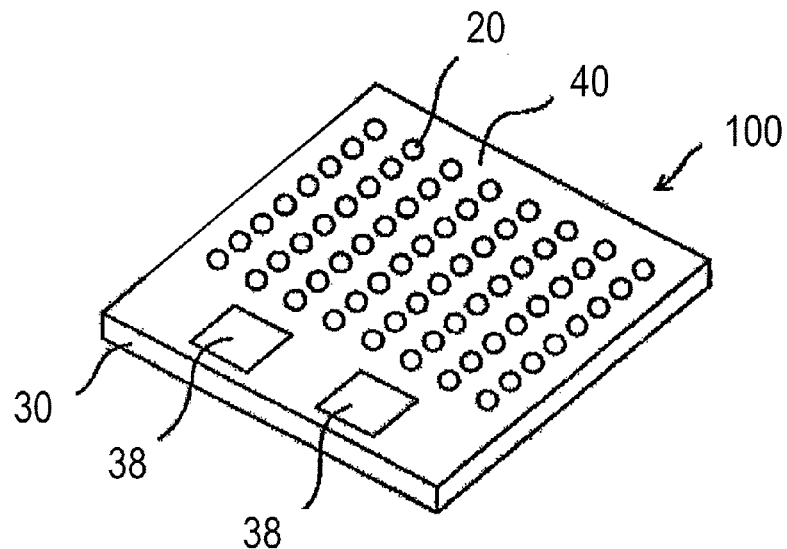
FIG. 5 is a perspective view schematically illustrating a configuration for a card LED lamp 100 according to another preferred embodiment of the present invention.

FIG. 5 illustrates a configuration for a card LED lamp 100 including a plurality of LED chips (i.e., an array or cluster of LEDs) that are arranged two-dimensionally. The substrate 30 includes a plurality of light-transmissive members 20, each covering an associated one of the LED chips (not shown). The side surface portion 24 of the substantially hemispherical part of each light-transmissive member 20 includes the low-transmittance part 26. Thus, this card LED lamp 100 has an anti-glare function. In this example, for each and every LED chip arranged on the substrate, the side surface portion 24 of its associated light-transmissive member 20 includes the low-transmittance part 26. However, the present invention is in no way limited to this specific preferred embodiment. The anti-glare effect is achieved by providing the low-transmittance parts 26 for the side surface portions 24 of at least the light-transmissive members located on the outermost area of the cluster of LEDs.

On the surface of the card LED lamp 100, arranged are feeder terminals 38 that are electrically connected to the interconnect pattern 36 for supplying electric power to the LED chips 10. To use the card LED lamp 100, a connector (not shown), to/from which the LED lamp 100 is readily insertable and removable, and a lighting circuit (not shown, either) may be electrically connected together and the card LED lamp 100 may be inserted into the connector.

Suppose the LED lamp 100 shown in FIG. 5 is used as a downlight, for example. In that case, the low-transmittance part 26 is preferably defined in the light-transmissive member 20 such that the LED lamp 100 has a luminance of 24,000 cd/m$^2$ or less, more preferably 5,300 cd/m$^2$ or less (and even more preferably 2,400 cd/m$^2$ or less), when the luminance is measured at an angle of around 65 degrees with respect to a normal to the center of the LED lamp 100 (i.e., a normal to the substrate 30). If the luminance is 24,000 cd/m$^2$ or less, the G2 conditions according to the G classification can be satisfied. And by decreasing the luminance to 5,300 cd/m$^2$ or less and 2,400 cd/m$^2$ or less, the G0 and G1 conditions according to the G classification can be satisfied, respectively.

It should be noted that the "G classification" is a type of glare classification that was drawn up as a luminance control guideline as a method for rating the uncomfortable glare of indoor luminaire, complies with the CIE Glare Safeguard System, but was simplified with the past records within this country of Japan taken into account. According to this classification, G0 and G1 refer to luminaire, of which the glare is sufficiently reduced by adopting a louver or a prism panel. G2 refers to luminaire, of which the glare is reduced by designing the luminaire such that the lamp is invisible horizontally as in bottom-opened luminaire. And G3 refers to luminaire, of which the glare is not controlled at all by exposing the lamp entirely.

Figure 6:
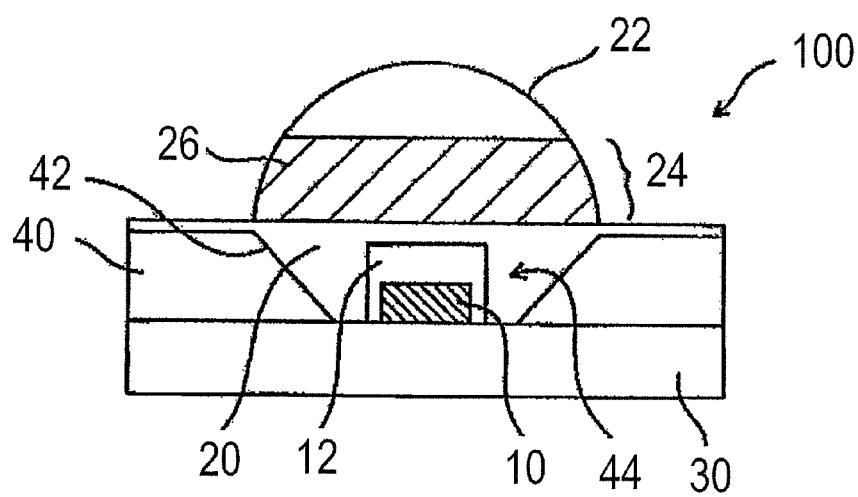
FIG. 6 is a cross-sectional view schematically illustrating a configuration for an LED lamp 100 according to another preferred embodiment of the present invention.

As shown in FIG. 6, in the configuration in which the light-transmissive member 20 fills the opening 44 of the reflector 40, almost all, or even all, of the side surface portion 24 in the substantially hemispherical portion of the light-transmissive member 20, protruding upward out of the upper surface of the reflector 40, may be the low-transmittance part 26.

Figure 7:
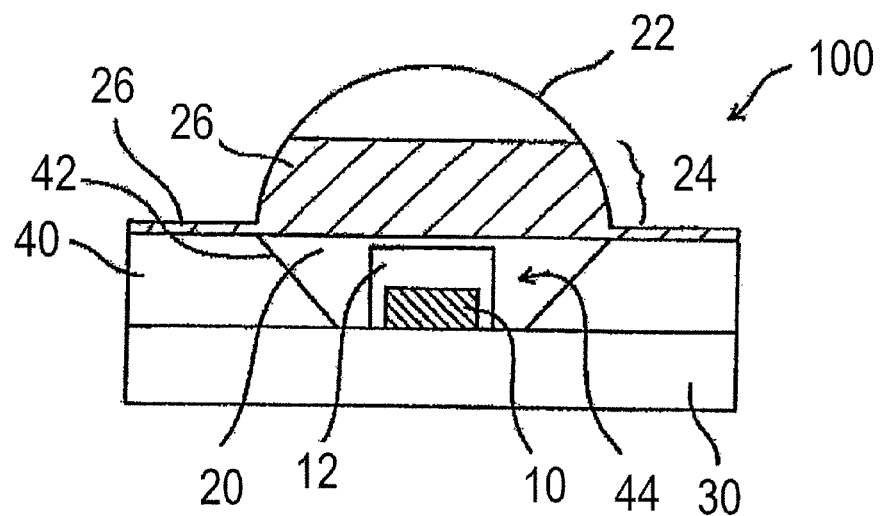
FIG. 7 is a cross-sectional view schematically illustrating a configuration for an LED lamp 100 according to another preferred embodiment of the present invention.

FIG. 7 illustrates an example in which the low-transmittance part 26 of the light-transmissive member 20 is expanded onto the upper surface of the reflector 40. By adopting such a configuration, the light obliquely leaking upward from the reflector 40 can be reduced.

Figure 8:
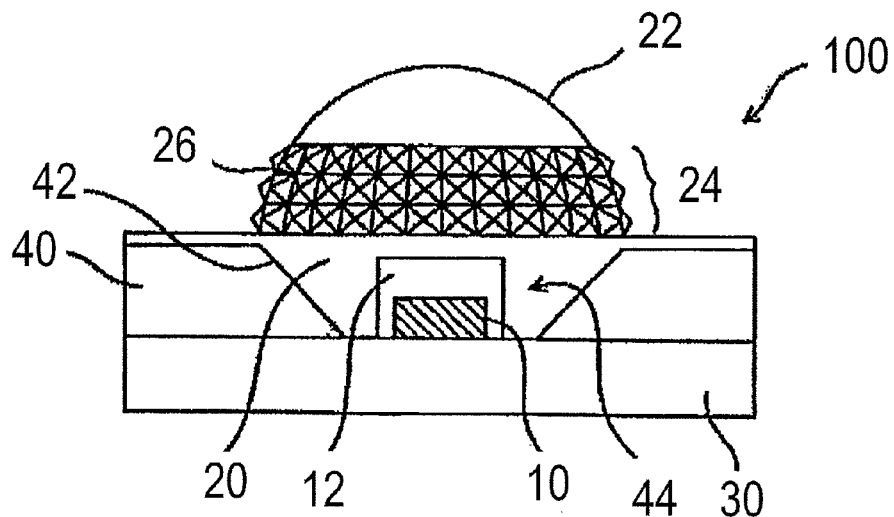
FIG. 8 is a cross-sectional view schematically illustrating a configuration for an LED lamp 100 according to another preferred embodiment of the present invention.

FIG. 8 illustrates an example in which a prism panel is provided so as to function as the low-transmittance part 26. a prism panel scatters light, thus producing glittering effects. As a result, the brightness can be increased.

It is also effective to position the low-transmittance part 26 with an angle of radiation, at which the viewer (or user) tends to feel glare, taken into consideration. Generally speaking, if the viewer is located far away from an illumination source, the luminance is too low to give glaring impression to him or her. If the viewer is located right under an illumination source, however, the luminance is high but the light rarely enters his or her eyes directly unless he or she turns his or her face up toward the ceiling. That is why by reducing the light being radiated at angles falling within a predetermined range, the glare can be minimized effectively without decreasing the overall quantity of light so much.

Figure 9:
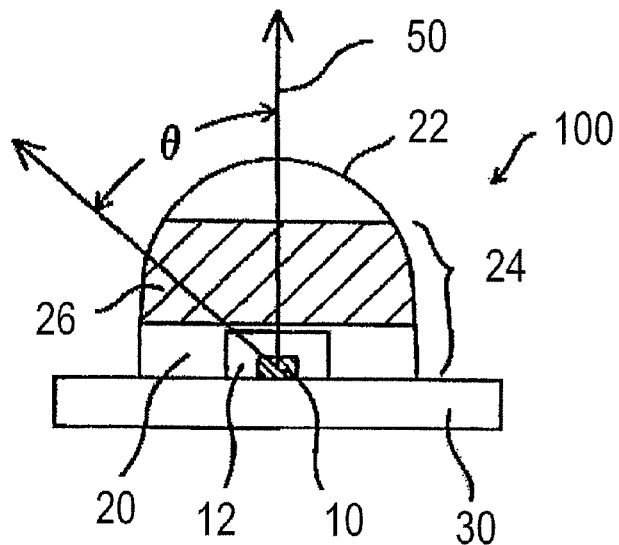
FIG. 9 is a cross-sectional view schematically illustrating a configuration for an LED lamp 100 according to another preferred embodiment of the present invention.

FIG. 9 shows an angle of radiation θ in the LED lamp 100 of this preferred embodiment. In FIG. 9, the direction pointed by the arrow 50 is the direction in which an optical axis passing the LED chip 10 extends and which has an angle of radiation θ of zero degrees. It should be noted that if the LED lamp 100 is supposed to project light perpendicularly from the ceiling, the arrow 50 points straight downward from the LED lamp 100.

Figure 10:
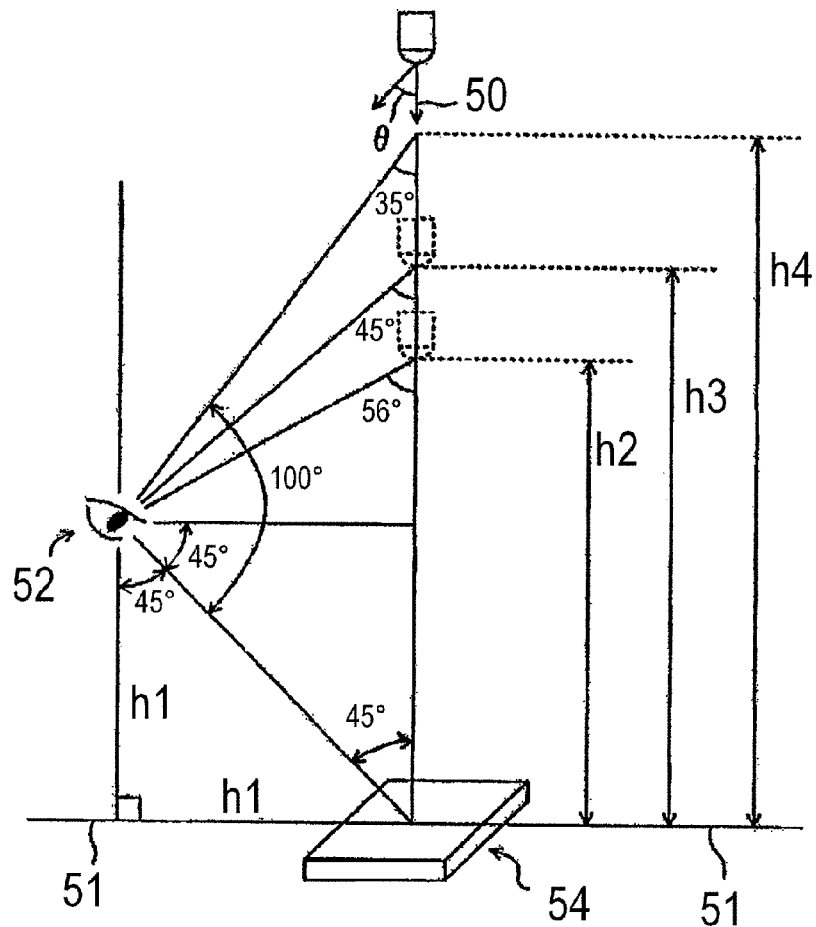
FIG. 10 illustrates a positional relationship among an illumination source, a viewer and an object being illuminated in a situation where the viewer is doing some work with his or her eyes fixed on a working plane.

Next, a situation where the LED lamp projects light straight downward from the ceiling onto a working plane, at which a viewer is working with his or her eyes fixed thereon will be described with reference to FIG. 10.

Suppose a viewer working at a work desk is watching a working plane 54 from a height h1 of 30 cm (i.e., the distance from his or her eyes 52 to the desk surface 51) at an angle of 45 degrees with respect to the perpendicular direction. If the LED lamp is a desk lamp, then the height h2 as measured from the desk surface 51 will be about 50 cm and the angle of radiation θ of the light that reaches the viewer's eyes 52 from the LED lamp will be 56 degrees. On the other hand, the maximum viewing angle of the viewer's eyes 52 will be 100 degrees as defined from the center of his or her viewpoint on the upper side of his or her eyeballs. In that case, the height h4 at or below which he or she can sense the LED lamp while working will be 72 cm as measured from the desk surface 51 and the angle of radiation θ will be 35 degrees. That is to say, there is no concern about glare if the lamp is located at least 72 cm away from the desk surface 51 while the viewer is working.

That is why in discussing how to reduce the glaring impression on the working viewer, it is important to consider an LED lamp that is located at a height of 50 cm to 72 cm as measured from the desk surface 51. In that case, the light entering the viewer's sight from the LED lamp has an angle of radiation θ of 35 to 56 degrees, which may be represented as 45 degrees±10 degrees. It should be noted that the height h3 associated with the angle of radiation θ of 45 degrees is 60 cm as measured from the desk surface 51. Considering that the viewer naturally turns his or her eyeballs or neck up and down while working, the glaring impression given by the LED lamp to the viewer can be reduced without decreasing the intensity of the light projected onto the working plane 54 by controlling the luminance associated with the angle of radiation θ of 45 degrees±15 degrees.

Figure 11:
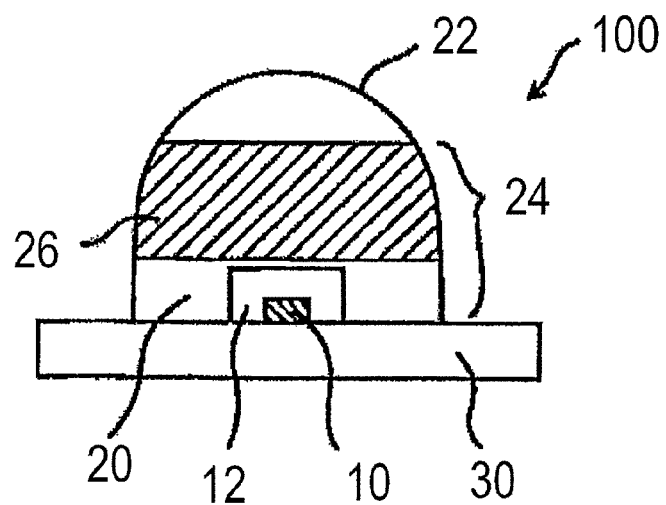
FIG. 11 is a cross-sectional view schematically illustrating a configuration for an LED lamp 100 according to another preferred embodiment of the present invention.

In view of these considerations, to realize an LED lamp 100 that can further reduce the glare, the low-transmittance part 26 is preferably positioned so as to have an angle of radiation θ of approximately 45 degrees (e.g., θ=45 degrees±15 degrees). And if the glare needs to be reduced more than anything else, then a mask (or opaque portion) with a transmittance of 0% is preferably provided as the low-transmittance part 26 for the side surface portion 24 that has an angle of radiation θ of 45 degrees as shown in FIG. 11. The low-transmittance part 26 functioning as a mask may be made of a resin to which a blue-ray-absorbing dye has been added (e.g., an epoxy resin).

Figure 12:
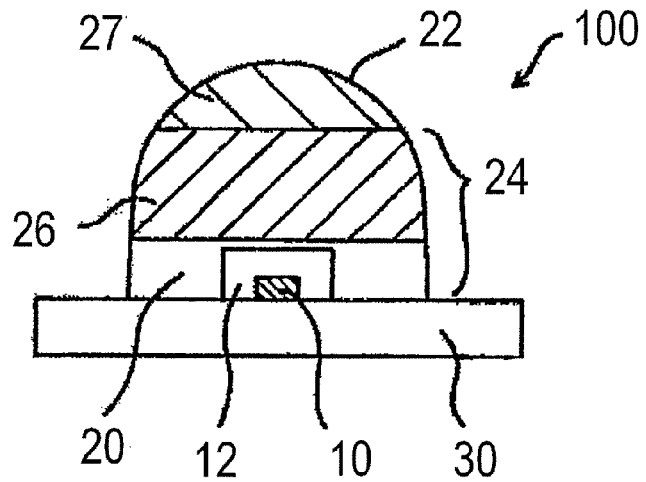
FIG. 12 is a cross-sectional view schematically illustrating a configuration for an LED lamp 100 according to another preferred embodiment of the present invention.

Optionally, to reduce the glaring impression on the viewer who is positioned right under the LED lamp, at least a part of the upper surface portion 22 may be a diffusing surface 27 as shown in FIG. 12. Specifically, the upper surface portion 22 may have a milky white color or include a prism panel. Alternatively, the light transmittance of the upper surface portion 22 may be reduced to the point that the luminance of the upper surface portion 22 is decreased to 10,000 cd/m$^2$ or less. As another alternative, the reflective surface 42 of the reflector 40 may be a diffusing surface.

When viewed from over the substrate 30, the upper surface portion 22 faces the viewer approximately squarely. However, if the upper surface portion 22 has a substantially hemispherical shape or a bullet-shaped appearance, then it is difficult to find where is the face of the upper surface portion 22 or even where the upper surface portion 22 is. In that case, a portion where the light-transmissive member has an angle of radiation θ of 15 degrees or less may be defined as the upper surface portion 22.

Embodiment 2

Figure 13:
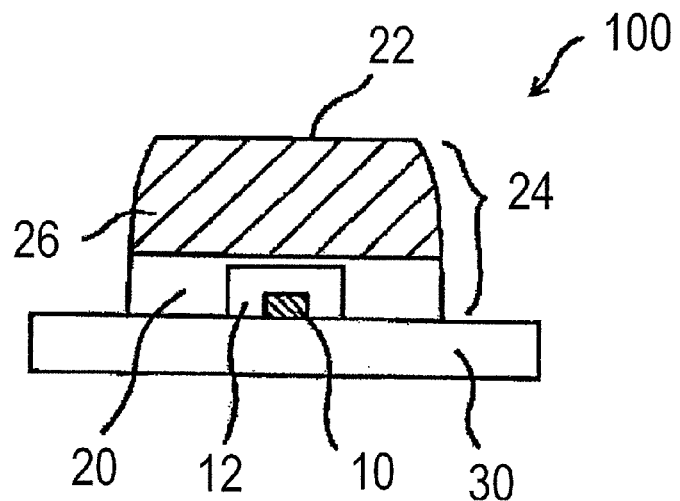
FIG. 13 is a cross-sectional view schematically illustrating a configuration for an LED lamp 100 according to another preferred embodiment of the present invention.

Hereinafter, a preferred embodiment of an LED lamp, of which the light-transmissive member 20 has a flat upper surface portion 22, will be described. FIG. 13 is a cross-sectional view of an LED lamp 100 according to this preferred embodiment and FIG. 14 is perspective view of the LED lamp 100.

Figure 14:
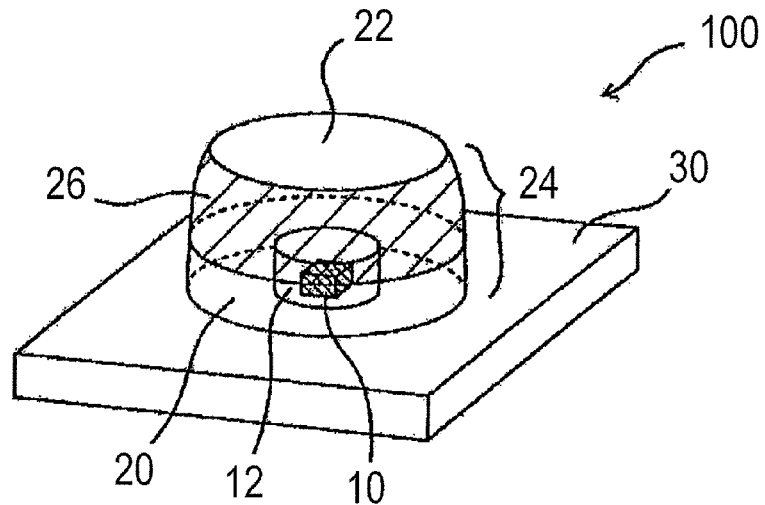
FIG. 14 is a perspective view schematically illustrating the configuration of the LED lamp 100 according to the preferred embodiment of the present invention.

In this preferred embodiment, the light-transmissive member 20 has a substantially trapezoidal cross section as viewed on a plane that is perpendicular to the principal surface of the substrate 30 as shown in FIGS. 13 and 14. As in the preferred embodiment described above, a part of the side surface portion 24 of the light-transmissive member 20 is the low-transmittance part 26. Thus, the emission of the LED lamp 100 can be effectively directed toward the direction that is perpendicular to the substrate 30 (with an angle of radiation θ=0 degrees) and the glare can be reduced as a result.

Figure 15:
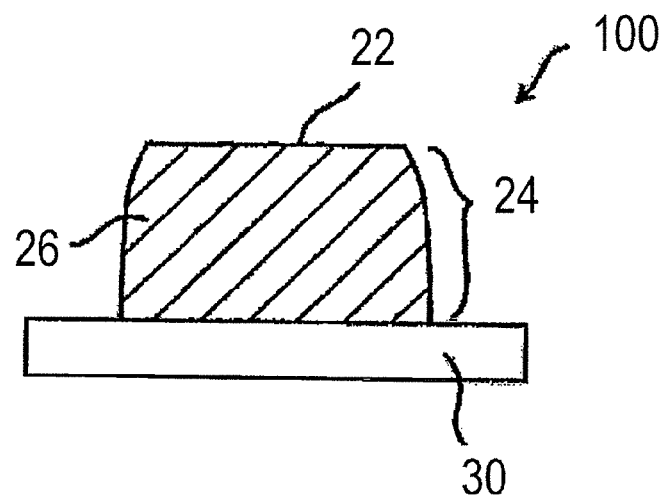
FIG. 15 is a cross-sectional view schematically illustrating a configuration for an LED lamp 100 according to another preferred embodiment of the present invention.

In this preferred embodiment, a part of the side surface portion 24 of the light-transmissive member 20 functions as the low-transmittance part 26. Alternatively, all of the side surface portion 24 may function as the low-transmittance part 26 as shown in FIG. 15. Optionally, the upper surface portion 22 may have a diffusing surface.

Embodiment 3

Figure 16:
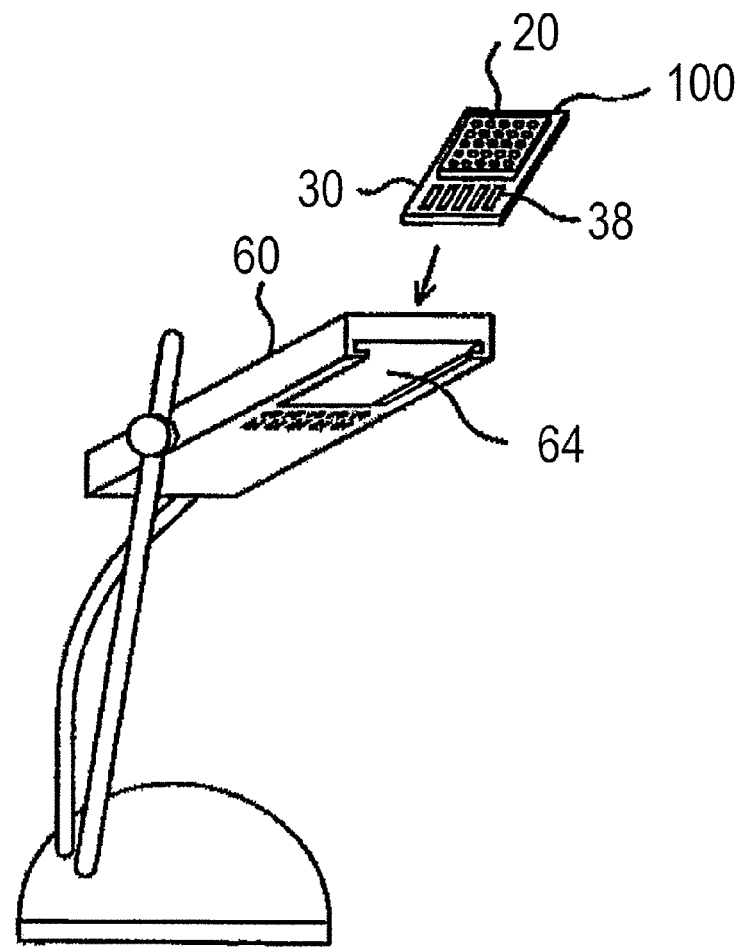
FIG. 16 is a perspective view schematically illustrating an exemplary application of an LED lamp 100 as a downlight.
Figure 17:
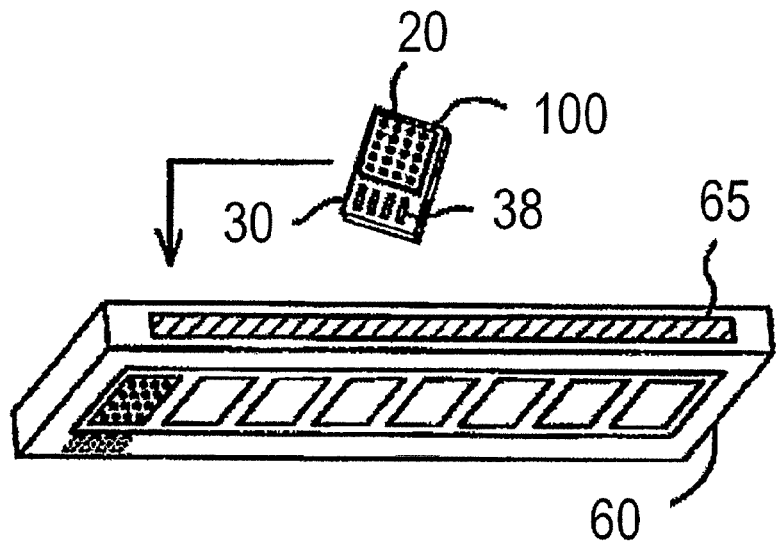
FIG. 17 is a perspective view schematically illustrating another exemplary application of an LED lamp 100 as a downlight.
Figure 18:
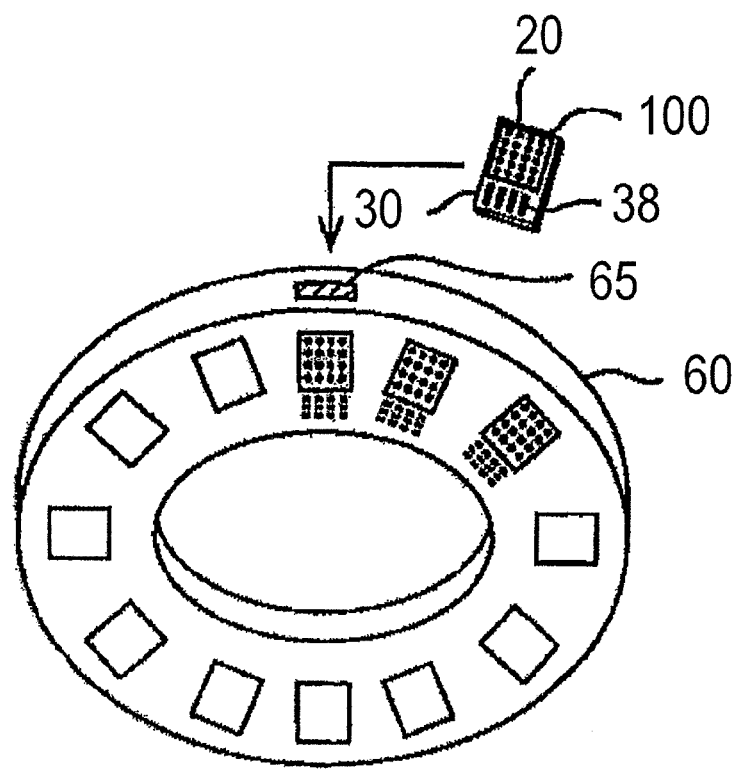
FIG. 18 is a perspective view schematically illustrating another exemplary application of an LED lamp 100 as a downlight.

If an LED lamp 100 according to any of various preferred embodiments described above is used as a downlight, one of the embodiments shown in FIGS. 16, 17 and 18 may be adopted, for example. In each of these examples, the LED lamp 100 is a card LED lamp. FIG. 16 illustrates an exemplary configuration for a desk lamp. FIG. 17 illustrates an exemplary configuration that can be used as a replacement for a straight-tube fluorescent lamp. And FIG. 18 illustrates an exemplary configuration that can be used as a replacement for a circular-tube fluorescent lamp.

In the example illustrated in FIG. 16, the card LED lamp 100 is set by being inserted into a receptacle portion 164, which is provided for its body portion 160, so as to get ready to turn ON.

On the other hand, in the examples illustrated in FIGS. 17 and 18, the card LED lamp 100 is set through a slot 65, which has been cut through their body portion 60, and gets ready to turn ON. The body portion 60 is connected to an AC power supply and includes a lighting circuit. Since the card LED lamp 100 has the antiglare function, the glare can also be reduced in the applications shown in FIGS. 16, 17 and 18.

In the preferred embodiments described above, a bare chip LED is supposed to be used as the LED chip 10 and mounted onto the substrate 30. However, the antiglare effect can also be achieved by any other embodiment, not just by those embodiments.

Embodiment 4

The LED lamp 100 of each of various preferred embodiments described above includes the reflector 40. However, the effects of the present invention are achievable even without the reflector 40.

Figure 19:
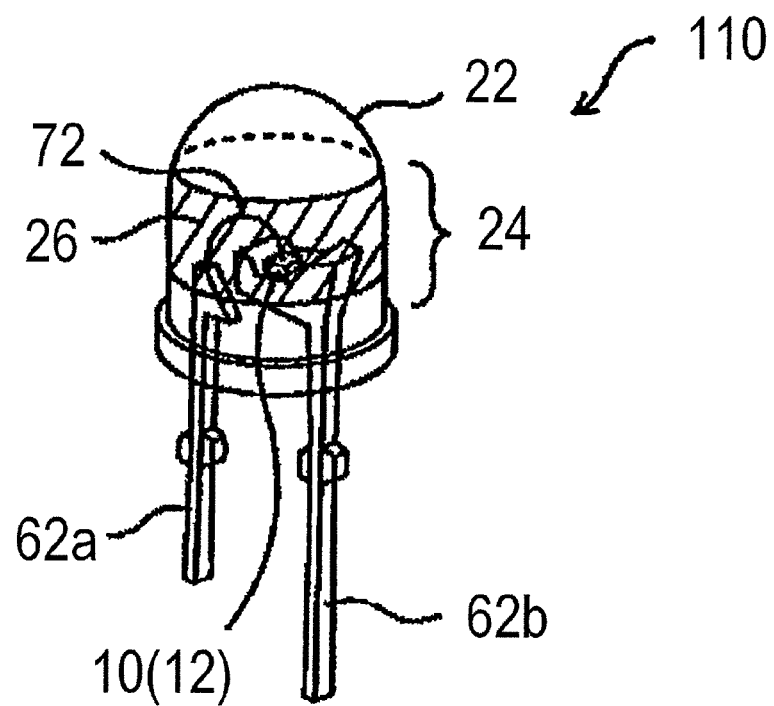
FIG. 19 is a perspective view schematically illustrating a configuration for an LED lamp 110 according to another preferred embodiment of the present invention.

FIG. 19 illustrates a configuration for a bullet-shaped LED lamp 100 including leads 62a and 62b. In this preferred embodiment, the LED chip 10 is also covered with the phosphor resin (not shown) and the light-transmissive member 20. The upper surface portion 22 of the light-transmissive member 20 has a curved surface defining the bullet shape. However, at least a part of the side surface portion 24 of the light-transmissive member 20 is the low-transmittance part 26. The LED chip 10 is mounted on one lead 62b and is connected to the other lead 62a with a bonding wire 72. The glare can also be reduced even without providing any reflector as in this preferred embodiment.

Embodiment 5

Figure 20:
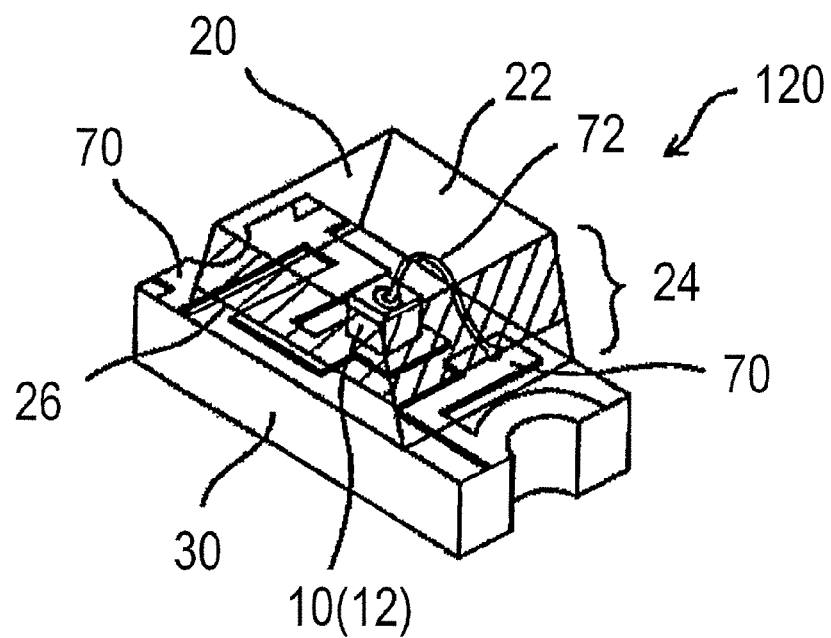
FIG. 20 is a perspective view schematically illustrating a configuration for an LED lamp 120 according to another preferred embodiment of the present invention.

FIG. 20 illustrates a chip-type LED lamp 120. The LED chip 10 shown in FIG. 20 has a face-bonded electrode structure and is bonded on the substrate 30 including a wiring pattern 70 thereon. The LED chip 10 has electrode terminals on the top and back surfaces of the substrate. One of the electrode terminals is connected to the wiring pattern 70 either directly or via solder, for example, while the other electrode terminal is connected to another part of the wiring pattern 70 via a bonding wire 72. In this example, the light-transmissive member 20 is also arranged so as to cover the LED chip 10 and the phosphor resin portion (not shown) and at least a part of the side surface portion 24 of the light-transmissive member 20 is the low-transmittance part 26. Consequently, the glare can also be reduced.

INDUSTRIAL APPLICABILITY

The present invention provides an LED lamp that can reduce the glaring impression, thus contributing to popularizing LED lamps as general illumination sources.

The invention claimed is:

1. An LED lamp comprising:
an LED chip; and
a light-transmissive member that covers the LED chip,
wherein the surface of the light-transmissive member includes an upper surface portion located over the LED chip and a side surface portion located below the upper surface portion, at least a part of the side surface portion having a lower transmittance than the upper surface portion,
wherein the upper surface portion of the light-transmissive member is arranged so as to define an angle of at most 15 degrees with respect to an optical axis that extends through the LED chip, and
wherein an upper surface of the light-transmissive member is substantially flat, wherein the light-transmissive member has a plurality of side surfaces, and at least one of the plurality of side surfaces has a substantially trapezoidal shape.

2. The LED lamp of claim 1, wherein at least one of the plurality of side surfaces has a substantially rectangular shape.

3. The LED lamp of claim 1, wherein the light-transmissive member has a substantially box-like shape.

4. The LED lamp of claim 3, wherein the light-transmissive member has a substantially prismoid shape or a substantially trapezoidal prism shape.

5. An LED lamp comprising:
a substrate;
an array of LED chips that are arranged two-dimensionally on the substrate: and
a plurality of light-transmissive members, each of which covers an associated one of the LED chips,
wherein some of the light-transmissive members are located in the outermost part of the array of LED chips, and the surface of at least each of those light-transmissive members includes an upper surface portion located over an associated one of the LED chips and a side surface portion located below the upper surface portion, at least a part of the side surface portion having a lower transmittance than the upper surface portion,
wherein the upper surface portion is arranged so as to define an angle of at most 15 degrees with respect to an optical axis that extends through the LED chip, and
wherein upper surface of each of the plurality of light-transmissive members is substantially flat, wherein each of the plurality of light-transmissive members has a plurality of side surfaces, and at least one of the plurality of side surfaces has a substantially trapezoidal shape.

6. The LED lamp of claim 5, wherein at least one of the plurality of side surfaces has a substantially rectangular shape.

7. The LED lamp of claim 5, wherein each of the plurality of light-transmissive members has a substantially box-like shape.

8. The LED lamp of claim 7, wherein each of the plurality of light-transmissive members has a substantially prismoid shape or a substantially trapezoidal prism shape.

* * * * *